US012446410B2

(12) United States Patent
Kim

(10) Patent No.: US 12,446,410 B2
(45) Date of Patent: Oct. 14, 2025

(54) ELECTROLUMINESCENCE DISPLAY

(71) Applicant: LG Display Co., Ltd., Seoul (KR)

(72) Inventor: AhnKi Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 569 days.

(21) Appl. No.: 17/977,956

(22) Filed: Oct. 31, 2022

(65) Prior Publication Data

US 2023/0217722 A1 Jul. 6, 2023

(30) Foreign Application Priority Data

Dec. 30, 2021 (KR) ........................ 10-2021-0193055

(51) Int. Cl.
*H10K 59/122* (2023.01)
*H10K 59/38* (2023.01)
*H10K 59/88* (2023.01)

(52) U.S. Cl.
CPC ........... *H10K 59/122* (2023.02); *H10K 59/38* (2023.02); *H10K 59/88* (2023.02)

(58) Field of Classification Search
CPC ...... H10K 59/122; H10K 59/88; H10K 59/38; H10K 59/124; H10K 59/121; H10K 59/80523
See application file for complete search history.

(56) References Cited

U.S. PATENT DOCUMENTS

| | | | | |
|---|---|---|---|---|
| 2009/0251048 | A1 | 10/2009 | Choi et al. | |
| 2016/0087244 | A1* | 3/2016 | Kim .................. | H10K 59/8052 257/40 |
| 2021/0043705 | A1 | 2/2021 | Lim et al. | |

FOREIGN PATENT DOCUMENTS

| | | | |
|---|---|---|---|
| EP | 3291302 | A2 | 3/2018 |
| EP | 3694010 | A1 | 8/2020 |
| KR | 10-2020-0082491 | A | 7/2020 |
| KR | 10-2021-0017179 | A | 2/2021 |

OTHER PUBLICATIONS

European Patent Office, Extended European Search Report, European Patent Application No. 22204782.1, Jun. 7, 2023, five pages.

* cited by examiner

*Primary Examiner* — Fatima N Farokhrooz
(74) *Attorney, Agent, or Firm* — Fenwick & West LLP

(57) ABSTRACT

An electroluminescence display is discloses that has enhanced display quality by reducing reflection of external light. An electroluminescence display comprises: a pixel defined on a substrate; a first electrode disposed at the pixel; a trench at least partially surrounding the pixel; a first metal layer on a bottom surface in the trench; a bank on an outer periphery of the first electrode and on the first metal layer in the trench; a second metal layer on the bank that is in the trench; an emission layer on the first electrode, the bank, and the second metal layer; and a second electrode on the emission layer.

25 Claims, 8 Drawing Sheets

ELECTROLUMINESCENCE DISPLAY

CROSS-REFERENCE TO RELATED APPLICATION

This application claims the benefit of the Republic of Korea Patent Application No. 10-2021-0193055 filed on Dec. 30, 2021, which is hereby incorporated by reference in its entirety.

BACKGROUND

Field of Technology

The present disclosure relates to an electroluminescence display having enhanced display quality by reducing reflection of external light. Especially, the present disclosure relates to a bottom emission type electroluminescence display that suppresses external light reflection from a cathode electrode and from the trench region disposed between pixels to prevent horizontal leakage current.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

The electroluminescence display, which is a self-luminous display, may have a structure in which a plurality of pixel areas including light emitting diodes are disposed. As the density of the pixel increases, the distance between adjacent pixels decreases, and pixel information may be distorted due to a leakage current between the pixels adjacent in the horizontal direction. In order to ensure excellent display quality, it is necessary to develop a structure for an electroluminescence display to suppress a horizontal leakage current between neighboring pixel areas.

Furthermore, in the electroluminescence display that is a self-luminous display device with excellent display quality, an external light reflection suppressing structure can be accomplished by disposing a polarization element in front of the display panel. The polarizing element for suppressing external light reflection may have a problem of reducing the amount of light provided by the display device, and it is very expensive element. Therefore, there is a demand for the development of a structure for an electroluminescence display capable of suppressing external light reflection without adding a polarizing element.

SUMMARY

The purpose of the present disclosure, as for solving the problems described above, is to provide an electroluminescence display having a low reflection cathode electrode capable of reducing display quality deterioration due to the reflection of the external light by the cathode electrode. Another purpose of the present disclosure is to provide an electroluminescence display for reducing display quality reduction due to current leakage in a horizontal direction as the distance between pixel areas in a display having a high pixel density becomes narrow. Still another purpose of the present disclosure is to provide an electroluminescence display with a structure including a low reflective cathode electrode and a trench between pixel areas to prevent leakage current for suppressing external light reflection caused by not normally depositing a low reflective cathode electrode in the trench.

In order to accomplish the above mentioned purposes of the present disclosure, an electroluminescence display according to the present disclosure comprises: a pixel defined on a substrate; a first electrode disposed at the pixel; a trench that at least partially surrounds the pixel; a first metal layer on a bottom surface in the trench; a bank on an outer periphery of the first electrode and on the first metal layer in the trench; a second metal layer in the trench, the second metal layer on the bank in the trench; an emission layer on the first electrode, the bank, and the second metal layer; and a second electrode on the emission layer.

In one embodiment, an electroluminescence display comprises: a substrate; a transistor on the substrate; a planarization layer on the transistor; a light emitting element on the planarization layer that is electrically connected to the transistor, the light emitting element including a first electrode, an emission layer including a first portion that is on the first electrode, and a second electrode including a first portion that is on the first portion of the emission layer; a trench through a thickness of the planarization layer, the trench at least partially surrounding the light emitting element; a first metal layer in the trench; a bank including a first portion and a second portion, the first portion of the bank on the first electrode and the second portion of the bank on the first metal layer in the trench; a second metal layer in the trench, the second metal layer on the second portion of the bank that is in the trench, wherein a second portion of the second electrode extends from the first portion of the second electrode into the trench such that the second portion of the second electrode is on the second portion of the bank that is in the trench.

In one embodiment, an electroluminescence display comprises: a substrate; a transistor on the substrate; a planarization layer on the transistor; a light emitting element on the planarization layer that is electrically connected to the transistor, the light emitting element including a first electrode, an emission layer on the first electrode, and a second electrode on the emission layer; a bank including a first portion that is on the first electrode; a trench through a thickness of the planarization layer, the trench at least partially surrounding the light emitting element; and a light reflection suppression structure in the trench, the light reflection suppression structure including a plurality of metal layers configured to suppress reflection of light incident on the light reflection suppression structure.

The electroluminescent display according to the present disclosure may include a structure for suppressing external light reflection by sequentially stacking three conductive layers for the cathode electrode configuring the light emitting element. A thin metal layer is disposed at the lower layer to ensure transmittance, a transparent resin layer made of a conductive resin material is stacked at the middle layer, and a thick metal layer with high reflectivity is stacked at the upper layer. Accordingly, the external light incident to the lower layer is partially reflected by the lower layer, and the remaining part passes through the lower layer and the transparent resin layer, and is reflected by the upper layer. Here, by making the light reflected from the lower layer have a phase opposite to that of the light reflected from the upper layer, the reflection of external light may be suppressed to 2% or less by destructive interference.

In addition, by providing a trench between the pixel areas to separate the emission layer between the pixel areas, the leakage current in the horizontal direction may be prevented when ultra-high resolution is realized. Moreover, since the trench has a specific stacking structure for suppressing reflection of external light, so external light may be prevented at the trench region. According to the present disclosure, an ultra-high-resolution electroluminescence display may be provided for preventing image distortion due to leakage current, and the quality degradation due to external light reflection may be not caused.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
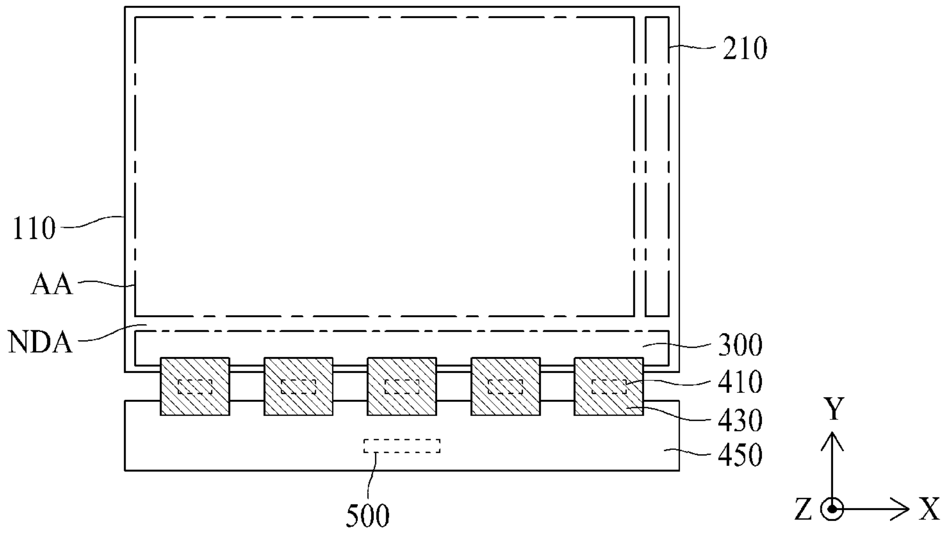
FIG. 1 is a plane view illustrating a schematic structure of an electroluminescence display according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

In the present specification, where the terms “comprise,” “have,” “include,” and the like are used, one or more other elements may be added unless the term, such as “only,” is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using “on,” “over,” “under,” “above,” “below,” “beside,” “next,” or the like, one or more other parts may be located between the two parts unless a more limiting term, such as “immediate(ly),” “direct(ly),” or “close(ly)” is used. For example, where an element or layer is disposed “on” another element or layer, a third layer or element may be interposed there-between. Also, if a first element is described as positioned “on” a second element, it does not necessarily mean that the first element is positioned above the second element in the figure. The upper part and the lower part of an object concerned may be changed depending on the orientation of the object. Consequently, where a first element is described as positioned “on” a second element, the first element may be positioned “below” the second element or “above” the second element in the figure or in an actual configuration, depending on the orientation of the object.

In describing a temporal relationship, when the temporal order is described as, for example, “after,” “subsequent,” “next,” or “before,” a case which is not continuous may be included unless a more limiting term, such as “just,” “immediate(ly),” or “direct(ly),” is used.

It will be understood that, although the terms “first,” “second,” and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illustrating a schematic structure of an electroluminescence display according to one embodiment of the present disclosure. In FIG. 1, X-axis refers to the direction parallel to the scan line, Y-axis refers to the direction of the data line, and Z-axis refers to the height direction of the display device.

Referring to FIG. 1, the electroluminescence display comprises a substrate 110, a gate (or scan) driver 210, a data pad portion 300, a source driving IC (integrated circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for displaying the video images, may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area that does not display the video images, may be defined at the circumference areas of the substrate 110 surrounding all or some of the display area AA. In the non-display area NDA, the gate driver 210 and the data pad portion 300 may be formed or disposed.

The gate driver 210 may supply the scan (or gate) signals to the scan lines according to the gate control signal received from the timing controller 500. The gate driver 210 may be formed at the non-display area NDA at any one outside of the display area AA on the substrate 110, as a GIP (Gate driver In Panel) type. GIP type means that the gate driver 210 is directly formed on the substrate 110.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA at any one outside of the display area AA on the substrate 110, as a TAB (Tape Automated Bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 210 and a source control signal for controlling the source driving IC 410, based on the timing signal. The timing controller 500 may supply the gate control signal to the gate driver 210 and supply the source control signal to the source driving IC 410. Depending on the product types, the timing controller 500 may be formed as one chip with the source driving IC 410 and mounted on the substrate 110.

First Embodiment

Figure 2:
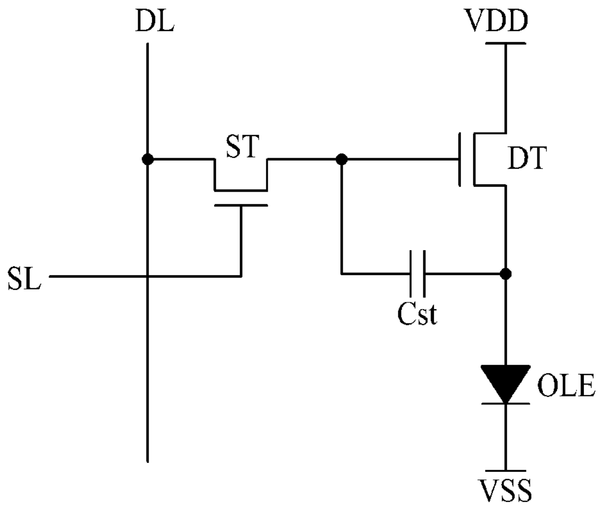
FIG. 2 is a circuit diagram illustrating a structure of one pixel included in the electroluminescence display according to one embodiment of the present disclosure.
Figure 3:
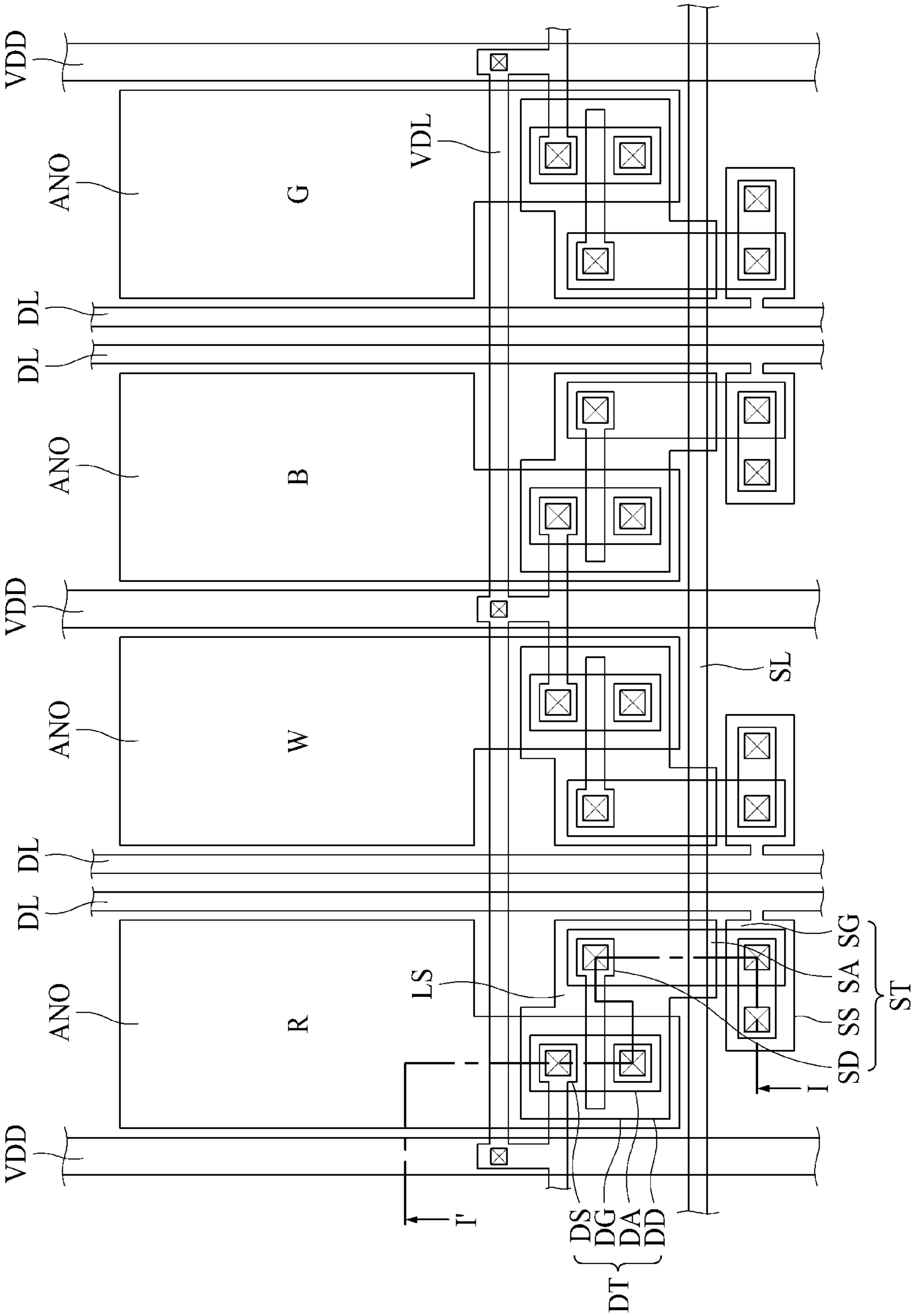
FIG. 3 is a plan view illustrating a structure of the pixels disposed in the electroluminescence display according to one embodiment of the present disclosure.
Figure 4:
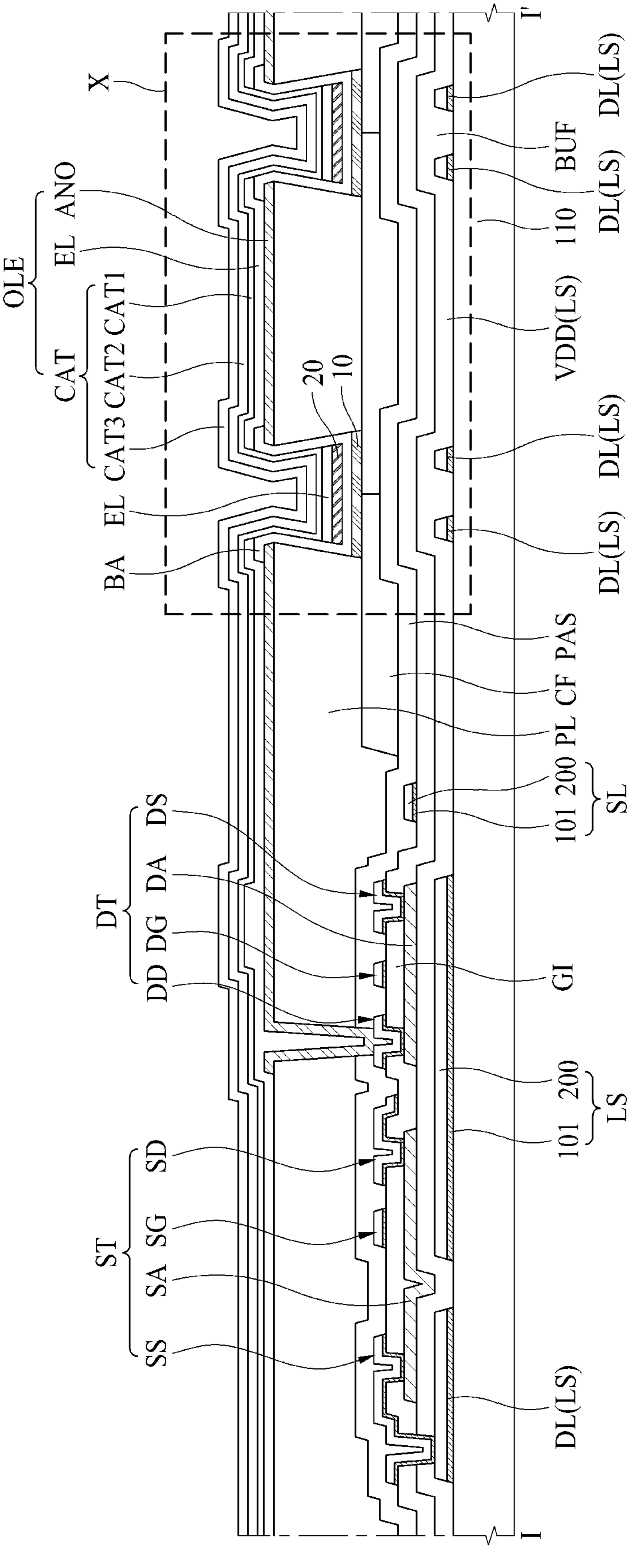
FIG. 4 is a cross-sectional view along cutting line I-I' in FIG. 3 that illustrates a low reflecting structure of the electroluminescence display according to a first embodiment of the present disclosure.

Hereinafter, referring to FIGS. 2 to 4, one embodiment of the present disclosure will be explained. FIG. 2 is a circuit diagram illustrating a structure of one pixel according to one embodiment of the present disclosure. FIG. 3 is a plan view illustrating a structure of the pixels according to one embodiment of the present disclosure. FIG. 4 is a cross-sectional view along cutting line I-I' in FIG. 3 that illustrates a low reflecting structure of the electroluminescent display according to a first embodiment of the present disclosure.

Referring to FIGS. 2 to 4, one pixel of the electroluminescence display may be defined by a scan line SL, a data line DL and a driving current line VDD. One pixel of the electroluminescence display may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate 110. For example, the switching thin film transistor ST may be disposed at the portion where the scan line SL and the data line DL is crossing. The switching thin film transistor ST may include a switching gate electrode SG, a switching source electrode SS and a switching drain electrode SD. The switching gate electrode SG may be connected to the scan line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT (e.g., a driving element) may play a role of driving the light diode OLE of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. For example, the driving gate electrode DG may be connected to the switching drain electrode SD via the drain contact hole DH penetrating the gate insulating layer GI. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric currents flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, a light emitting layer EL and a cathode electrode CAT. The light emitting diode OLE may emit the light according to the amount of the electric current controlled by the driving thin film transistor DT. In other words, the light emitting diode OLE may be driven by the voltage differences between the low-level voltage and the high-level voltage controlled by the driving thin film transistor DT. The anode electrode ANO of the light emitting diode OLE may be connected to the driving drain electrode DD of the driving thin film transistor DT, and the cathode electrode CAT may be connected to a low-level voltage line VSS where a low-level potential voltage is supplied. That is, the light emitting diode OLE may be driven by the high-level voltage controlled by the driving thin film transistor DT and the low-level voltage supplied from the low-level voltage line VSS.

Referring to FIG. 4, the cross-sectional structure of an electroluminescence display according to the first embodiment of the present disclosure will be explained. The light shielding layer LS may be disposed on the substrate 110. The light shielding layer LS may include a light shielding region and a signal line region. The signal line region of the light shielding layer LS may include the data line DL and the driving current line VDD. Further, the light shielding region of the light shielding layer LS may be disposed as being apart from the data line DL and the driving current line VDD with a predetermined distance, and having an island shape overlapping with the switching semiconductor layer SA of the switching thin film transistor ST and the driving semiconductor layer DA of the driving thin film transistor DT. The light shielding region of the light shielding layer LS is not used for any conductive line and may block the external light from intruding into the semiconductor layer SA and DA to reduce deterioration of the characteristics of the semiconductor layers SA and DA. In one embodiment, the light shielding region of the light shielding layer LS may be disposed as being overlapped with the channel regions in the semiconductor layers SA and DA which are overlapped with the gate electrodes SG and DG, respectively. In addition, the light shielding region of the light shielding layer LS may be disposed as being overlapped with some portions of the source-drain electrodes SS, SD, DS and DD respectively contacting to the semiconductor layers SA and DA.

On the light shielding layer LS, a buffer layer BUF is disposed as covering the whole surface of the substrate 110. On the buffer layer BUF, the switching semiconductor layer SA and the driving semiconductor layer DA are formed. In one embodiment, the channel areas in the semiconductor layers SA and DA are disposed as overlapping with the light shielding region of the light shielding layer LS.

A gate insulating layer GI may be disposed on the surface of the substrate 110 having the semiconductor layers SA and DA. On the gate insulating layer GI, a switching gate electrode SG may be formed as being overlapped with the switching semiconductor layer SA and a driving gate electrode DG may be formed as being overlapped with the driving semiconductor layer DA. At both sides of the switching gate electrode SG, a switching source electrode SS contacting with a first side of the switching semiconductor layer SA and being apart from the switching gate electrode SG may be formed, and a switching drain electrode SD contacting with a second side of the switching semiconductor layer SA and being apart from the switching gate electrode SG may be formed. In addition, at both sides of the driving gate electrode DG, a driving source electrode DS contacting with a first side of the driving semiconductor layer DA and being apart from the driving gate electrode DG may be formed, and a driving drain electrode DD contacting with a second side of the driving semiconductor layer DA and being apart from the driving gate electrode DG may be formed.

The gate electrodes SG and DG and the source-drain electrodes SS, SD, DS and DD are formed at the same layer, but are separated each other. The switching source electrode SS may be connected to the data line DL formed as a part of the signal line region of the light shielding layer LS via a contact hole penetrating the gate insulating layer GI and the buffer layer BUF. In addition, the driving source electrode DS may be connected to the driving current line VDD formed as another part of the signal region of the light shielding layer LS via another contact hole penetrating the gate insulating layer GI and the buffer layer BUF.

On the substrate 110 having the thin film transistors ST and DT, a passivation layer PAS may be deposited. The passivation layer PAS may be formed of inorganic layer such as silicon oxide or silicon nitride. A color filter CF may be formed on the passivation layer PAS. The color filter CF may be an element for representing color allocated at each pixel. For an example, one color filter CF may have a size and a shape corresponding to the size and the shape of one pixel. For another example, one color filter CF may have a size slightly larger than that of the light emitting diode OLE which will be formed later and may be disposed to overlap the light emitting diode OLE.

A planarization layer PL may be deposited on the color filter CF. The planarization layer PL may be a thin film for flattening or evening the non-uniform surface of the substrate 110 on which the thin film transistors ST and DT are formed. To do so, the planarization layer PL may be made of the organic materials. The passivation layer PAS and the planarization layer PL may have a pixel contact hole PH for exposing some portions of the drain electrode DD of the driving thin film transistor DT.

On the surface of the planarization layer PL, an anode electrode ANO may be formed. The anode electrode ANO may be connected to the drain electrode DD of the driving thin film transistor DT via the pixel contact hole PH. The anode electrode ANO may have different elements according to the emission condition of the light emitting diode OLE. For the bottom emission type in which the emitted light may be provided to the substrate 110, the anode electrode ANO may be made of a transparent conductive material. For the top emission type in which the emitted light may be provided to the direction opposite the substrate 110, the anode electrode ANO may include a metal material with excellent reflection ratio.

In the case of a large area display device such as a TV set, the cathode electrode CAT may be formed as one layer as covering a large area. The cathode electrode CAT maintains a uniform low voltage over a wide area. Therefore, in the case of a large-area display device, the cathode electrode CAT may be formed of an opaque metal material in order to maintain a low sheet resistance. Therefore, in the case of a large-area display device, the bottom emission type structure is used. For the bottom emission type, the anode electrode ANO may be made of a transparent conductive material. For example, the anode electrode ANO may include oxide conductive materials such as indium-zin-oxide (IZO) or indium-thin-oxide (ITO).

On the anode electrode ANO, a bank BA may be formed. The bank BA may define an emission area by covering the circumference area of the anode electrode ANO and exposing most middle areas of the anode electrode ANO.

An emission layer EL may be deposited on the anode electrode ANO and the bank BA. The emission layer EL may be deposited over the whole surface of the display area AA on the substrate 110, as covering the anode electrodes ANO and banks BA. For an example, the emission layer EL may include two or more stacked emission portions for emitting white light. In detail, the emission layer EL may include a first emission layer providing first color light and a second emission layer providing second color light, for emitting the white light by combining the first color light and the second color light.

For another example, the emission layer EL may include at least any one of blue-light emission layer, green-light emission layer and red-light emission layer as corresponding to the color allocated to the pixel. In addition, the light emitting diode OLE may further include at least one functional layer for enhancing the light emitting efficiency and/or the service lifetime of the emission layer EL.

The cathode electrode CAT may be disposed on the emission layer EL. The cathode electrode CAT may be stacked on the emission layer EL as being surface contact each other. The cathode electrode CAT may be formed as one sheet element over the whole area of the substrate 110 as being commonly connected whole emission layers EL disposed at all pixels. In the case of the bottom emission type, the cathode electrode CAT may include metal material having excellent light reflection ratio. For example, the cathode electrode CAT may include at least any one of silver (Ag), aluminum (Al), molybdenum (Mo), gold (Au), magnesium (Mg), calcium (Ca), or barium (Ba).

The present disclosure provides a low-reflection structure for reducing reflection of external light by the metal materials of the display device. For an example, the present disclosure provides a structure for reducing reflection of the external light by the cathode electrode CAT formed over the whole surface area of the substrate 110. Further, the present disclosure provides a structure for reducing reflection of the external light by the light shielding layer LS disposed at the closest layer to the substrate 100. In addition, present disclosure provides a structure for reducing reflection of external light by some portions of the gate line SL exposed to the bottom surface of the substrate 110 because the exposed portions of the gate line SL are not overlapped with the light shielding layer LS.

Figure 5:
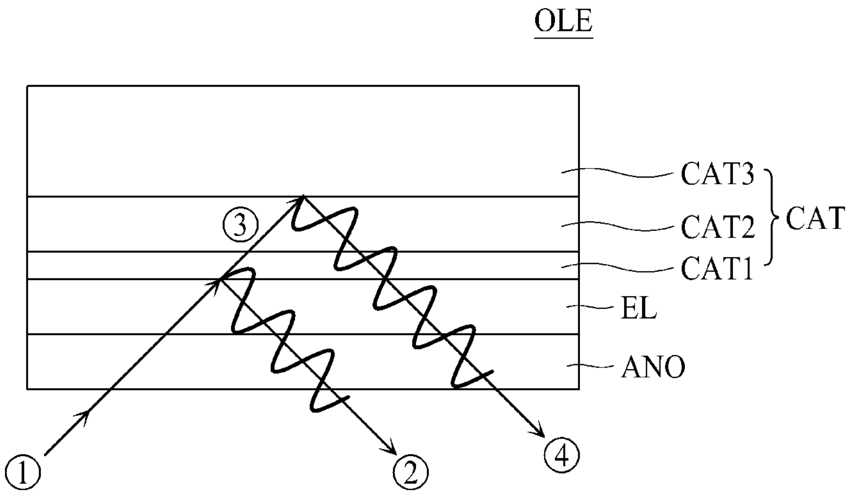
FIG. 5 is an enlarged cross-sectional view explaining a cathode electrode having a low-reflection structure in an electroluminescence display according to the first embodiment of the present disclosure.

Referring to FIG. 5, in the first embodiment of the present disclosure, the structure of the cathode electrode CAT for suppressing the reflection of the external light will be explained. FIG. 5 is an enlarged cross-sectional view explaining a cathode electrode having a low-reflection structure in an electroluminescence display according to the first embodiment of the present disclosure.

In a bottom emission type electroluminescence display according to the present disclosure, the cathode electrode CAT may include a plurality of cathode layers (e.g., three cathode layers). For example, the cathode electrode CAT may include a first cathode layer CAT1, a second cathode layer CAT2 and a third cathode layer CAT3 sequentially stacked on the emission layer EL. The first cathode layer CAT1 may be firstly stacked on the emission layer EL so as to be in direct surface contact with the emission layer EL. The first cathode layer CAT1 may made of a metal material having relatively low surface resistance. For example, the first cathode layer CAT1 may include any one of aluminum (Al), silver (Ag), molybdenum (Mo), gold (Au), magnesium (Mg), calcium (Ca), or barium (Ba). Considering the manufacturing process and cost, a case in which the first cathode layer CAT1 may be formed of aluminum will be explained as the most preferred example.

In the case that the first cathode layer CAT1 is made of aluminum, the first cathode layer CAT1 may be formed a thickness of 100 Å to 200 Å in one embodiment. The metallic materials such as aluminum are opaque and relatively highly reflective. However, as aluminum is formed very thin, light may pass through the thin aluminum layer. For example, for thin aluminum layer having a thickness of 200 Å or less, some portion (40%~50%) of incident light may be reflected by the aluminum layer, and the remained portions (50%~60%) may transmit the aluminum layer.

The second cathode layer CAT2 may include conductive resin materials. The conductive resin materials may include a domain material made of a resin material with high electron mobility and a dopant for lowering the barrier energy of the domain material. The resin materials having high electron mobility may include anyone selected from Alq3, TmPyPB, Bphen, TAZ and TPB. Alq3 may be an abbreviation of 'Tris(8-hydroxyquinoline) Aluminum', and be a complex having a chemical formula of $Al(C_9H_6NO)_3$. TmPyPB may be an organic material that is an abbreviation of '1,3,5-tri(m-pyrid-3-yl-phenyl) benzene'. Bphen may be an organic material that is an abbreviation of 'Batho-phenanthroline'. TAZ may be organic material that is an abbreviation of '1,2,3-triazole'. TPB may be organic material that is an abbreviation for triphenyl bismuth. Since these organic materials have high electron mobility, they may be used in a light emitting element.

The dopant materials may include an alkali-based doping material. For example, the dopant materials may include at least any one of lithium (Li), cesium (Cs), cesium oxide ($Cs_2O_3$), cesium nitride ($CsN_3$), rubidium (Rb) and rubidium oxide ($Rb_2O$). For another example, the dopant materials may include fullerene having high electron mobility. Fullerene may be a generic term for molecules in which carbon atoms are arranged in a sphere, ellipsoid or cylinder shape. For example, the dopant materials may include Buckminster-fullerene (C60) in which 60 carbon atoms are mainly bonded in the shape of a soccer ball. In addition, the dopant materials may include higher fullerenes such as C70, C76, C78, C82, C90, C94 and C96.

The second cathode layer CAT2 may have the same materials as the electron transporting layer or electron injecting layer included into the emission layer EL. However, unlike the electron transporting layer or the electron injecting layer, it is preferable that the second cathode layer CAT2 may have higher electron mobility than the electron transporting layer or the electron injecting layer. For example, the electron transporting layer or the electron injecting layer may have the electron mobility of $5.0\times10^{-4}$ (S/m) to $9.0\times10^{-1}$ (S/m), whereas the second cathode layer CAT2 may have an electron mobility of $1.0\times10^{-3}$ (S/m) to $9.0\times10^{+1}$ (S/m). For this, it is preferable that the conductive resin materials included into the second cathode layer CAT2 may have a dopant content higher than that of the electron transporting layer or the electron injecting layer.

For example, the electron transporting layer or the electron injecting layer has a dopant doping concentration of 2% to 10%, whereas the second cathode layer CAT2 may be preferably a conductive resin material having a dopant doping concentration of 10% to 30%. The domain material itself, in which the dopant has a doping concentration of 0%, may have an electrical conductivity of 1.0x10-4 (S/m) to $5.0\times10^{-3}$ (S/m). By doping 10% to 30% of dopant into the domain material, the second cathode layer CAT2 may have improved electrical conductivity to $1.0\times10^{-3}$ (S/m) to $9.0\times10^{+1}$ (S/m) to be used as a cathode electrode.

In one case, the second cathode layer CAT2 may have the same conductivity as the electron functional layer (electron transporting layer and/or electron injecting layer) of the emission layer EL. In this case, the sheet resistance of the cathode electrode CAT may be maintained at a sufficiently low value due to the first cathode layer CAT1 made of aluminum.

The third cathode layer CAT3 may be made of the same material as the first cathode layer CAT1. In one embodiment, the third cathode layer CAT3 may have a sufficient thickness so that the sheet resistance of the cathode electrode CAT may be maintained at a constant value regardless of the position of the substrate SUB while not transpassing the light but reflecting all of the light. For example, the third cathode layer CAT3 may be formed of a metal material having a low sheet resistance to have a relatively thicker thickness than the first and second cathode layers CAT1 and CAT2 in order to reduce the overall sheet resistance of the cathode electrode CAT. For example, the third cathode layer CAT3 may be formed of aluminum having a thickness in range of 2,000 Å to 4,000 Å.

The cathode electrode CAT having such a thickness and a stacked structure mentioned above may reduce reflection ratio with respect to the light incident from the bottom direction of the substrate (i.e., from the outside to the first cathode layer CAT1). A portion requiring external light reflection suppression may be a display area that may mainly affect image information. Accordingly, a low reflection structure is implemented in the cathode electrode CAT that is commonly applied over the entire display area AA. Hereinafter, description will be made with reference to arrows indicating the optical path shown in FIG. 5.

Referring to the structure of the cathode electrode CAT included into light emitting diode OLE, the incident light ① from the lower outside of the cathode electrode CAT may transpass through the anode electrode ANO and the emission layer EL which are transparent. Some of the incident light ① may be reflected at the bottom (or lower) surface of the first cathode layer CAT1 and then proceed toward the substrate 110 as the first reflected light ②. Since the first cathode layer CAT1 has a thin thickness of 200 Å or less, all of the incident light ① may not be reflected. For example, 40% of the incident light ① may be reflected as the first reflected light ②, and the remaining 60% of the incident light ① may pass through the first cathode layer CAT1. The whole amount of the transmitted light ③ passing through the first cathode layer CAT1 may pass through the transparent second cathode layer CAT2. After that, the transmitted light ③ may be reflected by the third cathode layer CAT3. Since the third cathode layer CAT3 may have a thickness of 2,000 Å to 4,000 Å, whole amount of the transmitted light ③ may be reflected and proceed toward the substrate 110 as the second reflected light ④.

Here, by adjusting or changing the thickness of the second cathode layer CAT2, the phases of the first reflected light ② and the second reflected light ④ may be set to cancel each other. Accordingly, the reflected light luminance, which is the intensity of the reflected light incident from outside of the cathode electrode CAT and finally reflected to the outside of the substrate 110 may be reduced to 2% or less.

Meanwhile, among the lights emitted from the emission layer EL, the amount of light emitted to the direction of the cathode electrode CAT and reflected by the cathode electrode CAT may be reduced by about 2% through the same mechanism. However, since the light emitted from the emission layer EL may be propagated in all directions, the amount of light reduced by the cathode electrode CAT may be only about 50% of the total amount of the light from the emission layer EL, and the remaining 50% may be emitted toward the substrate 110.

The electroluminescence display according to the first embodiment may be the bottom emission type including cathode electrode CAT of a triple layer stacked structure. The reflection ratio of the external light may be suppressed as much as possible by the structure of the cathode electrode CAT of the triple layer stacked structure. Therefore, there is no need to dispose a polarization element on the outside of the substrate 110 to reduce the external light reflection. The polarization element has a positive effect of suppressing the external light reflection, but has a negative effect of reducing the amount of light emitted from the emission layer EL by at least 50%.

In the electroluminescence display according to the first embodiment, the amount of the light emitted from the emission layer EL may be reduced by about 50% due to the cathode electrode CAT of the triple layer stack structure, but this is almost the same as the reduction in the amount of light due to the polarization element. Accordingly, the electroluminescence display according to the present disclosure may reduce the external light reflection while providing the same level of luminous efficiency without using an expensive polarization element.

Figure 6:
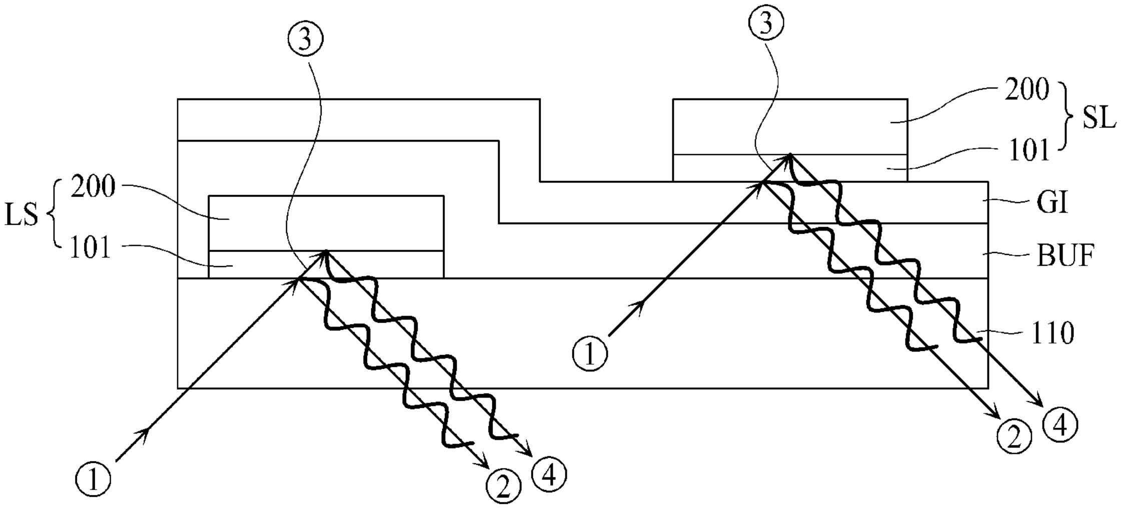
FIG. 6 is an enlarged cross-sectional view illustrating a light shielding layer and a gate line having a low-reflection structure in an electroluminescence display according to the first embodiment of the present disclosure.

Hereinafter, referring to FIG. 6, a structure for suppressing the reflection of the external light in the light shielding layer LS and the gate line SL will be explained. FIG. 6 is an enlarged cross-sectional view illustrating a light shielding layer and a gate line having a low-reflection structure in an electroluminescence display according to the preferred embodiment of the present disclosure.

In the first embodiment, the light shielding layer LS and the gate line SL, the gate electrodes SG and DG, the source-drain electrodes SS, SD, DS and DD and the link line VDL connecting the driving drain electrode DD to the driving current line VDD may have the structure for suppressing the external light reflection. For example, the gate line SL and the light shielding layer LS including the data line DL and the driving current line VDD may have a structure in which a first metal oxide layer 101 and a second metal layer 200 may be stacked sequentially.

The first metal oxide layer 101 may include low reflective metal oxide materials with a thickness in range of 100 Å to 500 Å. The low reflective metal oxide material may be formed of a metal oxide material such as molybdenum-titanium-oxide (MTO), molybdenum-copper-oxide (MoCuOx), or tungsten oxide (WOx). The second metal layer 200 may include low resistance metallic materials with a thickness in range of 2,000 Å to 4,000 Å. For example, the second metal layer 200 may include a single metal layer made of metal material such as copper (Cu), aluminum (Al), silver (Ag), gold (Au) and the likes, or a double metal layer having copper (Cu) and molybdenum-titanium alloy stacked each other.

Here, the first metal oxide layer 101 may be an oxide layer for matching the refractive index. Since the refractive index of the first metal oxide layer 101, which is an oxide, may be significantly different from that of the second metal layer 200, which is a metallic material, the reflection of the external light may be suppressed by using the phase destructive interference between the light reflected from the first metal oxide layer 101 and the light reflected from the second metal layer 200.

For example, as shown in FIG. 6, Some of the incident light ① passing through the substrate 110 from the bottom side of the light shielding layer LS and the gate line SL may be reflected by the bottom (or lower) surface of the first metal oxide layer 101 and then proceed toward the substrate 110 as the first reflected light ②. The first metal oxide layer 101 is an oxide material and has relatively high transparency, and may not reflect all of the incident light ① due to a difference in refractive index at the interference with the substrate 110. For example, about 40% of the incident light ① may be reflected as the first reflected light ②, other 60% off the incident light ① may pass through the first metal oxide layer 101. The transmitted light ③ passing through the first metal oxide layer 101 may be reflected by the opaque second metal layer 200. Since the second metal layer 200 is formed of an opaque metal material, all of the transmitted light ③ may be reflected and proceed toward the substrate 110 as the second reflected light ④.

Here, by adjusting or controlling the thickness of the first metal oxide layer 101, the phases of the first reflected light ② and the second reflected light ④ may be set to cancel each other. When it is desired to selectively lower the reflection ratio of green light to which the human eye is most sensitive, the thickness of the first metal oxide layer 101 may be set to corresponding to a multiple of a half wavelength of the green light. For example, when the representative wavelength of green light is 550 nm, the first metal oxide layer 101 may be formed to have a thickness of 275 Å which is a multiple of 275 nm that is a half wavelength of green light or any one thickness of 550 Å, 825 Å and 1,100 Å which are integer multiples of 275 Å. As a result, reflected light luminescence, which is the intensity of the reflected light that is incident to and reflected from the bottom outside of the light shielding layer LS and the gate line SL, may be reduced to a level of 2% or less.

The electroluminescence display according to the first embodiment may suppress the reflection of the external light at the cathode electrode CAT by applying the low-reflection structure to the cathode electrode CAT including metal material and deposited over the whole area of the substrate. In addition, by applying the low reflection structure using metal oxide layer to the light shielding layer LS and the gate line SL which is not covered by the light shielding layer LS, the reflection of the external light may be suppressed.

As described above, even when the light shielding layer LS and the gate line SL have an external light reflection suppression structure and the cathode electrode has an external light reflection suppression structure, the structure for suppressing external light reflection is not formed in the trench between the pixel areas, so that external light reflection may occur in the trench region because. For example, in the structure of the trench region, a trench TR may be disposed between two adjacent data line DL formed in the light shielding layer LS. The data line DL may have an external light reflection suppression structure. However, the trench TR is exposed between the data lines DL. The cathode electrode CAT may be stacked in the trench TR. Since the cathode electrode CAT may have the external light reflection structure, the external light may be suppressed in the trench TR.

As the resolution of the display gradually increases, the size of the pixels decreases and the space between the pixels also decreases. As a result, the width of the trench TR also becomes narrow. For example, when the resolution is less than 4K pixels per inch (PPI), the trench TR may normally have a normal external light reflection suppression structure even after the cathode electrode CAT is deposited inside the trench TR. However, in the case of having a resolution of 4K or higher, the width of the trench TR is very narrow, so the external light suppression structure of the cathode electrode CAT may be destructed inside of the trench TR.

Figure 7:
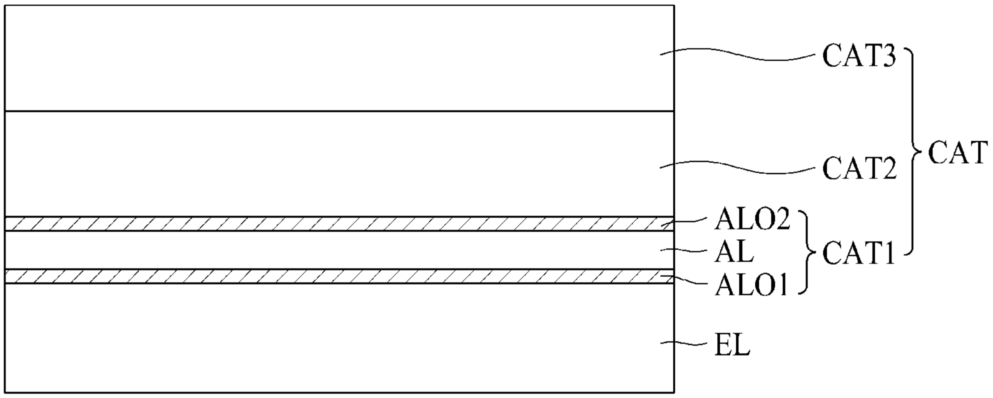
FIG. 7 is a cross-sectional view illustrating a cathode electrode having a structure for suppressing external light reflection according to one embodiment.

In the cathode electrode CAT having an external light reflection suppression structure according to the present disclosure, a first cathode layer CAT1, a second cathode layer CAT2, and a third cathode layer CAT3 are stacked sequentially. Hereinafter, with further reference to FIG. 7, a detailed structure of the cathode electrode CAT having an external light reflection suppression structure according to the present disclosure, and a structure in which this cathode electrode CAT is deposited in a trench TR having a very narrow width will be described. FIG. 7 is a cross-sectional view illustrating a cathode electrode having a structure for suppressing external light reflection.

For example, the first cathode layer CAT1 may have a thickness of 140 Å, the second cathode layer CAT2 may have a thickness of 500 Å, and the third cathode layer CAT3 may have a thickness of 2,000 Å. For example, the first cathode layer CAT1 is deposited using aluminum AL, and an oxide layer ALO1 is formed below and an oxide layer ALO2 is formed above the aluminum layer AL. As shown in FIG. 7, a first aluminum oxide layer ALO1 having a thickness of 40 Å at a lower layer, and a second aluminum oxide layer ALO2 having a thickness of 40 Å at an upper layer may be stacked, and aluminum layer AL may be formed to a thickness of 60 Å between the first aluminum oxide layer ALO1 and the second aluminum oxide layer ALO2.

When the first cathode layer CAT1 having a structure is stacked, inside the trench TR, the thickness of 140 Å may be not be formed, but may be formed with a thickness that is less than 140 Å. In this case, since the aluminum layer AL stacked in the middle layer of the first cathode layer CAT1 is particularly thin, the structure for destructive interference of the reflected lights for suppressing external light reflection may not be properly formed. Since the thickness of the first cathode layer CAT1 is set to suppress reflection of external reflection of external light in the light emitting diode OLE, it is not possible to have a different thickness in the trench TR area.

Referring to FIGS. 3 and 4, a data line DL or a driving current line VDD may be disposed under the trench TR. The data line DL and the driving current line VDD are formed on the same layer as the light shielding layer LS, and have the same configuration. However, in the case of having an ultra-high-resolution structure and having a trench TR to reduce horizontal leakage current between adjacent pixel areas, a degree of reflection of external light may be severely caused in the portion exposed between the data line DL. In order to further overcome this problem, the first embodiment of the present disclosure provides an electroluminescence display further having a specific external light reflection suppression structure inside the trench TR. In one embodiment, the light reflection suppression structure inside the trench TR includes a plurality of metal layers configured to suppress reflection of light incident on the light reflection suppression structure as will be further described below.

Figure 8:
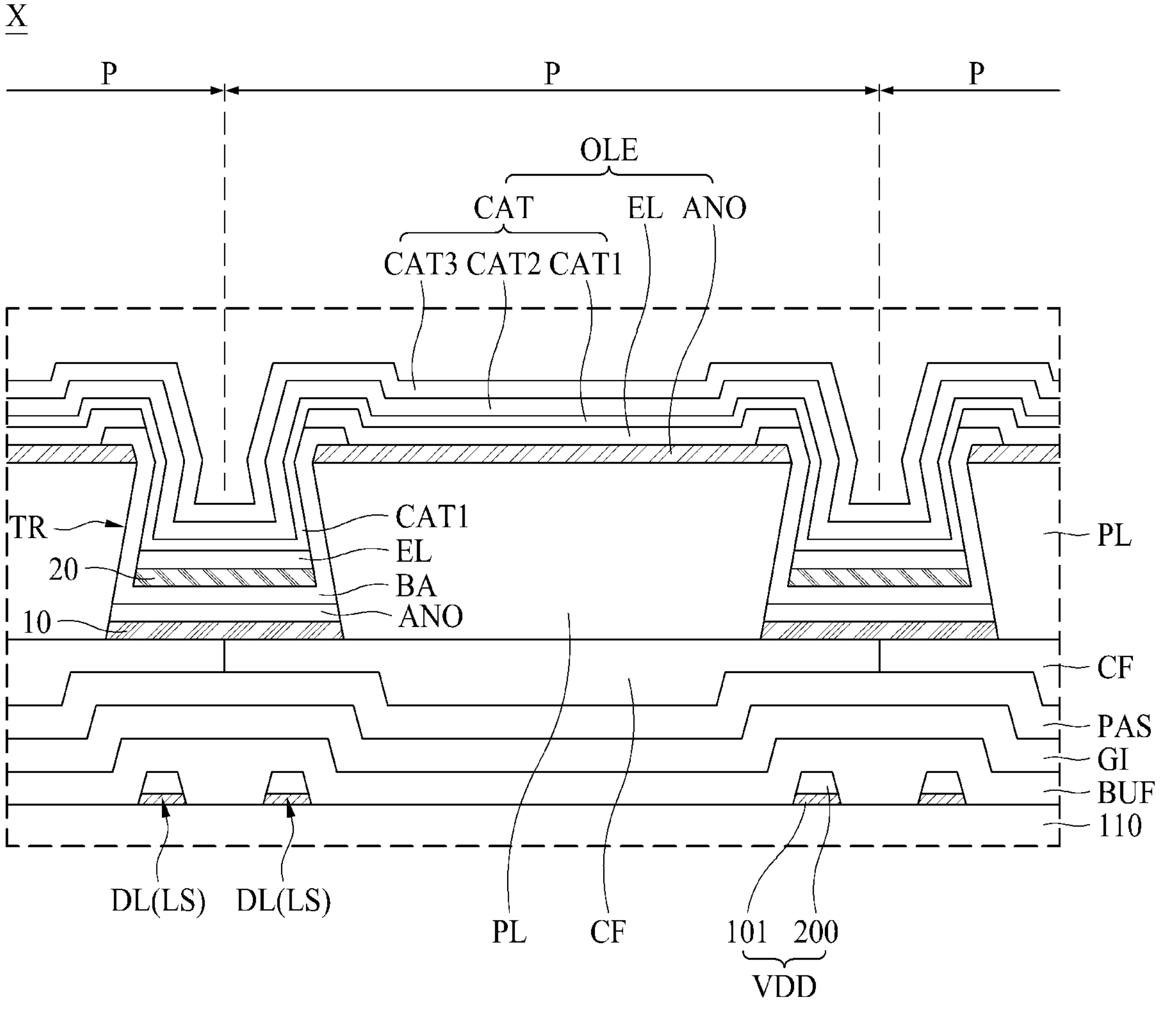
FIG. 8 is an enlarged cross-sectional view illustrating the structure of the electroluminescence display in which a portion marked with the rectangular shape X of FIG. 4 is enlarged according to the first embodiment of the present disclosure.

Hereinafter, a trench region having an external light reflection suppression structure in the first embodiment of the present disclosure will be described with further reference to FIG. 8. FIG. 8 is an enlarged cross-sectional view illustrating the structure of the electroluminescence display in which the portion marked with the rectangular shape X of FIG. 4 is enlarged according to the first embodiment of the present disclosure. Among the components of FIG. 8, descriptions of the same elements as those shown in FIG. 4 will be omitted when it is not necessary.

Referring to FIG. 8, a plurality of pixels P are sequentially arrayed. Between two adjacent pixels P, a trench TR is formed by etching the planarization layer PL. In one embodiment, the trench TR is an opening through a thickness of the planarization layer PL. In FIG. 8, the depth of the trench TR may be depicted as being same as the thickness of the planarization layer PL. However, it is not limited thereto, the trench TR may have a depth less than the thickness of the planarization layer PL.

After depositing the planarization layer PL, by patterning the planarization layer PL, the trench TR may be formed between two neighboring pixels. In one embodiment, the trench TR may be formed to surround the entire periphery of one-pixel area P. Here, in the case that the planarization layer PL is formed of a negative type organic material, the trench TR may have a reverse taper structure in which the width of the trench TR becomes wider toward the lower portion of the trench TR due to the characteristics of the material of the planarization layer PL.

In one embodiment, a lower metal layer 10 is on the bottom surface of the trench TR. The lower metal layer 10 may have a thickness in a range of 100 Å to 200 Å. The lower metal layer 10 may include silver (Ag), palladium (Pd), copper (Cu), or silver-palladium-coper alloy (APC; Ag—Pd—Cu). A transparent conductive material is deposited on the planarization layer PL having the trench TR in which the lower material layer 10 is formed on the bottom surface of the trench TR. As a result, the anode electrode ANO (e.g., a first electrode) separated per each pixel P by the trench TR is formed. In addition, the anode electrode ANO is also stacked on the lower metal layer 10 inside the trench TR. The anode electrode ANO stacked in the trench TR is physically and electrically separated from the anode electrode ANO stacked on the planarization layer PL. Accordingly, the anode electrode ANO stacked in the trench TR may be referred to as a dummy anode electrode to distinguish it from the anode electrode ANO disposed in the pixel P area.

In order to define an emission area in the anode electrode ANO separated per pixels P by the trench TR, a bank BA may be formed. Here, since the purpose of the trench TR may not be achieved when the bank BA covers the trench TR, the bank BA may be formed of an inorganic material so that the shape of the trench TR may be maintained as it is. For example, the bank BA may be formed as single layered or double layered structure in which any one of nitride silicon (SiNx), silicon dioxide (SiO2) and silicon oxide (SiOx). The bank BA made of inorganic insulating material may be transparent. The bank BA may have a structure covering the circumferences of the anode electrode ANO, and be stacked on the anode electrode ANO along the cross-sectional profile of the inside of the trench TR. As the result, the bank BA may be stacked on the anode electrode ANO on the bottom surface of the trench TR An upper metal layer 20 may be formed on a portion of the bank BA that is inside the trench TR. In one embodiment, the upper metal layer 20 may have a thickness in a range of 300 Å to 500 Å. The upper metal layer 20 may include silver (Ag), palladium (Pd), copper (Cu) or APC (Ag—Pd—Cu) alloy.

An emission layer EL is deposited on the whole surface of the substrate 110 including on the upper metal layer 20 that is in the trench TR. At the emission area of the pixel P region, the emission layer EL (e.g., a first portion of the emission layer EL) is deposited on the anode electrode ANO. The emission layer EL is also deposited on the bank BA in the pixel P region. In addition, in the trench TR, the emission layer EL (e.g., a second portion of the emission layer) is deposited on the upper metal layer 20. Due to the depth of the trench TR, the emission layer EL may be physically and electrically separated from emission layers EL in adjacent pixels P by the trench TR.

The trench TR may be a structural element for physically and electrically disconnecting the emission layer EL between adjacent pixels P. Therefore, the trench TR may have as much depth as possible. Further, the layers deposited before the emission layer EL may have a thickness that is as thin as possible. Considering these conditions, the lower metal layer 10, the anode electrode ANO, the bank BA and the upper metal layer 20 may be formed to have a thickness with the materials described above.

According to the first embodiment of the present disclosure, the thickness of the planarization layer PL is in range of 1 ㎛ to 2 ㎛. For example, the planarization layer PL may have a thickness of 1.8 ㎛ and the trench TR may have a depth of 1.8 ㎛. In detail, when the lower metal layer 10 with a thickness of about 200 Å, the anode electrode ANO with a thickness of about 2,000 Å, the bank BA with a thickness of about 3,000 Å, and the upper metal layer 20 with a thickness of about 500 Å are stacked, the whole thickness may be 5,700 Å which is less than 6,000 Å. As the result, the trench TR may be secured with a thickness of 12,000 Å (=1.2 ㎛). Therefore, the emission layer EL may be separated per each pixel P.

A cathode electrode CAT (e.g., a second electrode) is deposited on the emission layer EL. The cathode electrode CAT may include a first cathode layer CAT1, a second cathode layer CAT2 and a third cathode layer CAT3. The cathode electrode CAT may include a first portion that is on the first portion of the emission layer. In the trench TR, a second portion of the cathode electrode CAT is also stacked. In particular, as the first cathode layer CAT1 and third cathode electrode CAT3 of the cathode electrode CAT are made of inorganic material, they may be deposited to have a cross-sectional profile following the cross-sectional shape of the trench TR. Since the second cathode layer CAT2 is made of organic material, it may be disconnected by the trench TR. However, at least, the third cathode layer CATS may not be disconnected by the trench TR, but be continuously deposited over all pixels P of the substrate 110.

Referring to the stacking structure in the trench TR, the lower metal layer 10, the anode electrode ANO, the bank BA (e.g., the second portion of the bank BA), the upper metal layer 20 and the cathode electrode CAT (e.g., the second portion of the cathode electrode CAT) are sequentially stacked from bottom to up. From an optical viewpoint, it has a structure in which the lower metal layer 10 as a semi-transparent layer, the anode electrode ANO and the bank BA as a transparent layer, and the upper metal layer 20 and the cathode electrode CAT as a reflective layer are sequentially stacked. Therefore, by adjusting (or controlling) the thickness of the semi-transparent layer (the lower metal layer 10) and/or the thickness of the transparent layer (the anode electrode ANO and the bank BA), external light reflection may be suppressed.

Figure 9:
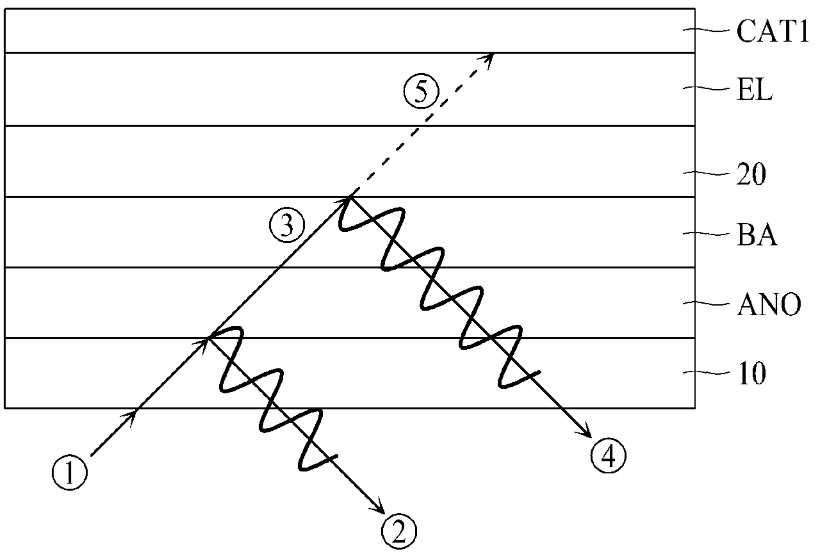
FIG. 9 is an enlarged cross-sectional view illustrating the low reflection structure formed at the trench region according to one embodiment.

Referring to FIG. 9, a mechanism for suppressing reflection of external light in the trench according to the first embodiment will be described. FIG. 9 is an enlarged cross-sectional view illustrating the low reflection structure formed at the trench region.

For example, the lower metal layer 10 may have a first thickness that ensures a light transmittance of 40% to 60%. In one embodiment, the bank BA has a second thickness such that the first reflected light from the lower surface of the lower metal layer 10 and the second reflected light from the upper metal layer 20 after passing through the lower metal layer 10 and the bank BA are phase-offset (or phase-cancelled) from each other.

Referring to the optical structure at the trench TR, the incident light ① entering from the lower outside of the trench TR may be partially reflected from an upper surface of the semi-transparent lower metal layer 10 and proceeds toward the substrate 110 as a first reflected light ②. Since the lower metal layer 10 has a thin thickness of 100 Å to 200 Å, it may not reflect all of the incident light ①. For example, about 40% of the incident light ① is reflected as the first reflected light ②, and the remaining 60% passes through the lower metal layer 10. The transmitted light ③ passing through the lower metal layer 10 passes through the transparent bank BA as it is. Then, the transmitted light ③ is reflected by the upper metal layer 20. Since the upper metal layer 20 has a thickness of 300 Å to 500 Å, at least 80% of the transmitted light ③ is reflected to become a second reflected light ④ and goes toward the substrate 110.

Here, adjusting the thickness of the bank BA, the phases of the first reflected light ② and the second reflected light ④ may be set to cancel each other. As a result, reflected light luminance, which is the intensity of reflected light that is incident and reflected from the lower surface of the cathode electrode CAT, may be reduced to a level of 2%.

Meanwhile, in order to secure the depth of the trench TR, the upper metal layer 20 is not formed to a thickness having a 100% reflectance, but is formed to a thickness that may have a reflectivity of at least 80%. Accordingly, the maximum of 20% of the transmitted light ③ may be the re-transmitted light ⑤ passing through the upper metal layer 20. The re-transmitted light ⑤ passes through the light emitting layer EL and is incident on the cathode electrode CAT. Reflection of the re-transmitted light ⑤ may be suppressed by the same mechanism as described in FIG. 5.

Second Embodiment

Figure 10:
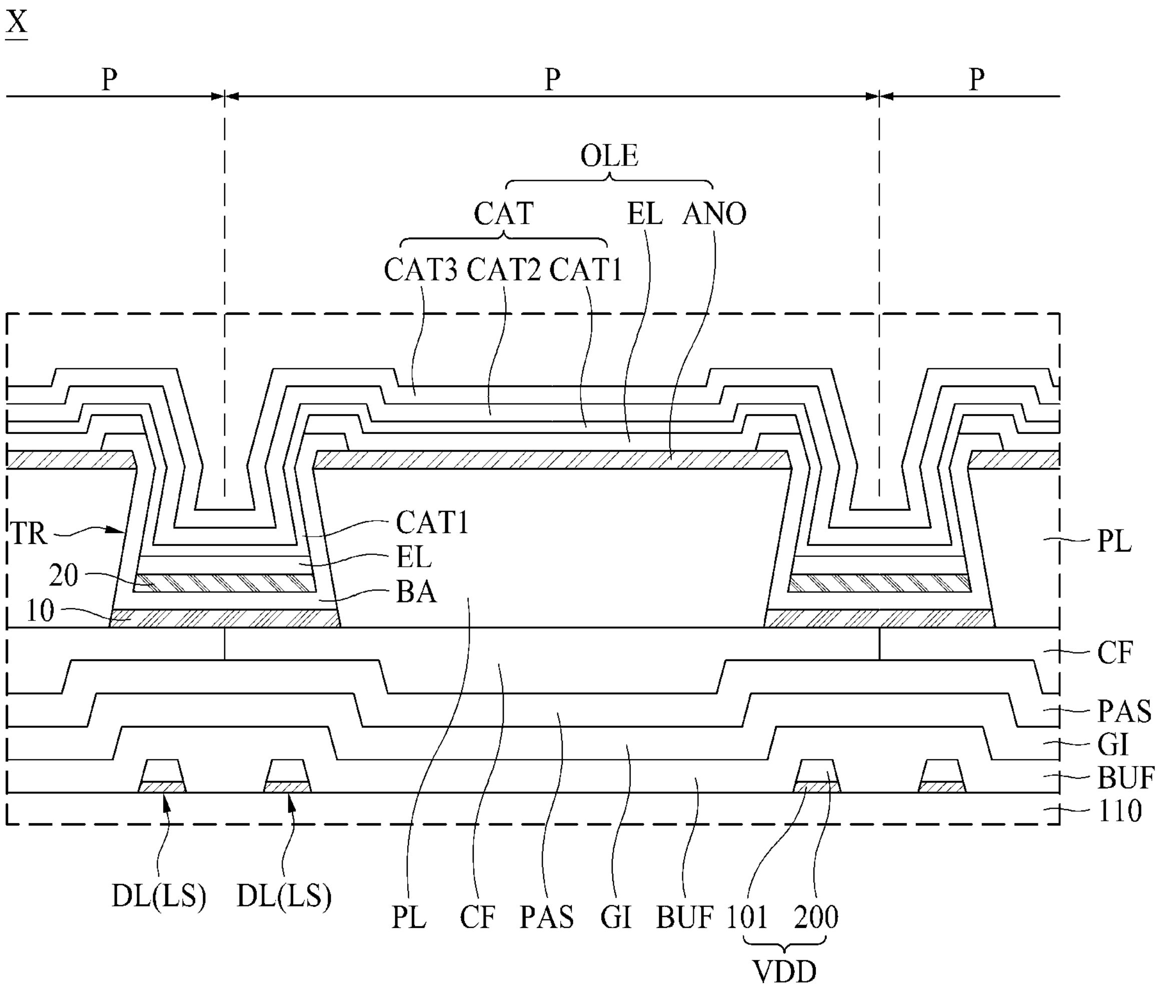
FIG. 10 is an enlarged cross-sectional view illustrating an electroluminescence display according to a second embodiment of the present disclosure.

Hereinafter, referring to FIG. 10, the second embodiment of the present disclosure will be described. FIG. 10 is an enlarged cross-sectional view illustrating an electroluminescence display according to the second embodiment of the present disclosure. The second embodiment is different from the first embodiment in the method and process for forming the trench TR. In the following description, structural features due to the difference in the method will be mainly described.

Referring to FIG. 10, a plurality of pixels P is arranged in a matrix manner Between two adjacent pixels P, a trench TR is formed by etching the planarization layer PL.

The planarization layer PL may be deposited on the entire surface of the substrate 110 having the color filter CF. After depositing a transparent conductive material on the planarization layer PL, the anode electrode ANO is formed by patterning the transparent conductive material layer. By patterning the planarization layer PL using the anode electrode ANO as a mask, the trench TR may be formed. Here, when the planarization layer PL is made of a negative type organic material, the trench TR may have a reverse tapered shape in which width of the trench may be wider toward the lower portion of the trench TR, due to the characteristics of the material.

A lower metal layer 10 is stacked on the bottom surface of the trench TR. In one embodiment, the lower metal layer 10 has a thickness of 100 Å to 200 Å. The lower metal layer 10 may include silver (Ag), platinum (or palladium) (Pd), copper (Cu) or a silver-palladium-copper alloy (APC). A bank BA for defining the emission area is formed in the anode electrode ANO divided for each pixel P by the trench TR.

Here, when the bank BA covers the trench TR, the purpose for the trench TR may not be acquired, so the trench TR may be made of silicon nitride (SiNx) that is an inorganic material for following the cross-sectional profile of the trench TR. The bank BA may cover edge (or circumference) portions of the anode electrode ANO, and be deposited as following the cross-sectional shape of the bank BA. Therefore, the bank BA is deposited on the lower metal layer 10 stacked on the bottom surface of the trench TR.

The upper metal layer 20 is on the bank BA in the trench. In one embodiment, the upper metal layer 20 has a thickness of 300 Å to 500 Å. The upper metal layer 20 includes any one of silver (Ag), platinum (or palladium) (Pd), copper (Cu) and silver-palladium-copper alloy (APC).

The emission layer EL is deposited on the entire surface of the substrate 110 including the trench TR in which the upper metal layer 20 is stacked. In the emission area of the pixel P, the emission layer EL is deposited on the anode electrode ANO. The emission layer EL is deposited on the bank BA in the pixel P region. Due to the depth of the trench TR, the emission layer EL may be physically and electrically separated (or divided) per each pixel P by the trench TR.

In the second embodiment of the present disclosure, the planarization layer PL may have a thickness in range of 1 ㎛ to 2 ㎛. For example, the planarization layer PL may have a thickness of 1.8 ㎛ and the trench TR may have a depth of 1.8 ㎛. In detail, when the lower metal layer 10 with a thickness of about 200 Å, the bank BA with a thickness of about 3,000 Å, and the upper metal layer 20 with a thickness of about 500 Å are stacked, the whole thickness may be 3,700 Å which is less than 4,000 Å. As the result, the trench TR may be secured with a thickness of 14,000 Å(=1.4 ㎛). Therefore, the emission layer EL may be separated per each pixel P.

A cathode electrode CAT is deposited on the emission layer EL. The cathode electrode CAT may include a first cathode layer CAT1, a second cathode layer CAT2 and a third cathode layer CATS. In the trench TR, the cathode electrode CAT is also stacked. In particular, the cathode electrode CAT is not disconnected at the trench TR, but is continuously connected over all pixels P despite being disposed in the trench TR.

Referring to the stacking structure in the trench TR, the lower metal layer 10, the bank BA, the upper metal layer 20 and the cathode electrode CAT are sequentially stacked from bottom upward. From an optical viewpoint, it has a structure in which the lower metal layer 10 as a semi-transparent layer, the bank BA as a transparent layer, and the upper metal layer 20 and the cathode electrode CAT as a reflective layer are sequentially stacked. Therefore, by adjusting (or controlling) the thickness of the semi-transparent layer (the lower metal layer 10) and/or the thickness of the transparent layer (the bank BA), external light reflection may be suppressed be the mechanism same as the cathode electrode CAT.

Third Embodiment

Figure 11:
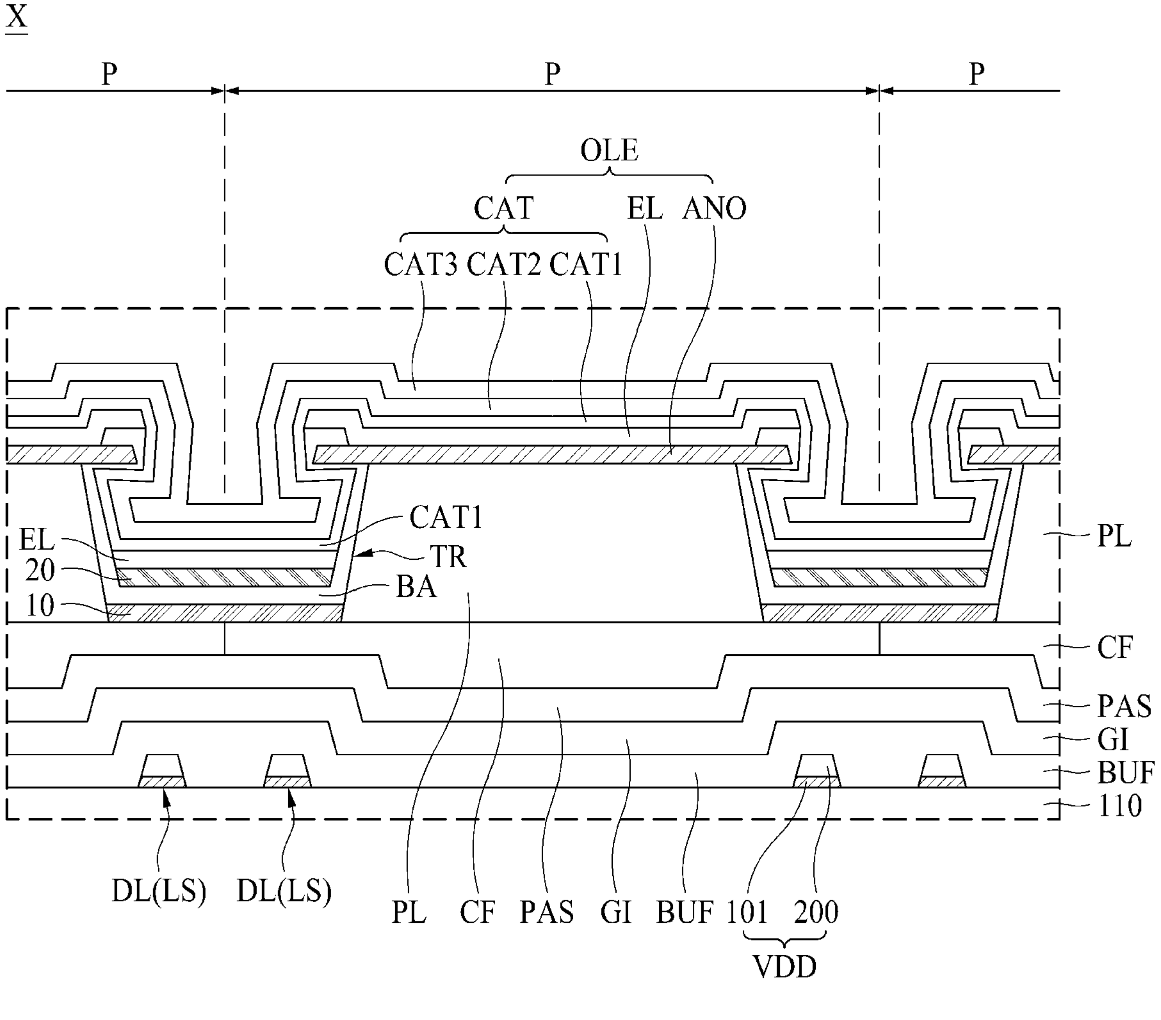
FIG. 11 is an enlarged cross-sectional view illustrating an electroluminescence display according to a third embodiment of the present disclosure.

Hereinafter, referring to FIG. 11, the third embodiment of the present disclosure will be described. FIG. 11 is an enlarged cross-sectional view illustrating an electroluminescence display according to the third embodiment of the present disclosure.

The electroluminescence display according to the third embodiment of the present disclosure has a feature that the planarization layer PL is made of a positive type resin material. When a positive type resin material is used, the trench TR does not have a reverse taper structure, but has a forward taper structure. When the trench TR has a forward tapered shape, the emission layer EL may not be disconnected for each pixel by the trench TR. Accordingly, in the third embodiment, a trench TR is formed to have an undercut structure below the anode electrode ANO by over etching the planarization layer PL Referring to FIG. 11, a plurality of pixels P are serially arrayed. Between two adjacent pixels P, a trench TR is formed by etching the planarization layer PL. The process for forming the trench TR is as follows.

The planarization layer PL may be deposited on the entire surface of the substrate 110 having the color filter CF. After depositing a transparent conductive material on the planarization layer PL, the anode electrode ANO is formed by patterning the transparent conductive material layer. By patterning the planarization layer PL using the anode electrode ANO as a mask, the trench TR may be formed. Here, when the planarization layer PL is made of a positive type organic material, the trench TR may have a forward tapered shape in which width of the trench may be narrower toward the lower portion of the trench TR, due to the characteristics of the material.

In this case, the emission layer EL that is subsequentially stacked may not be disconnected by the trench TR. In order to achieve the disconnected structure of the emission layer EL, the trench TR may be formed to have an under-cut structure between the edge region of the anode electrode ANO and the planarization layer PL by over-etching the planarization layer PL.

After that, a lower metal layer 10 is stacked on the bottom surface of the trench TR. In one embodiment, the lower metal layer 10 has a thickness of 100 Å to 200 Å. The lower metal layer 10 may include silver (Ag), platinum (or palladium) (Pd), copper (Cu) or a silver-palladium-copper alloy (APC). A bank BA for defining the emission area is formed on the anode electrode ANO and is divided for each pixel P by the trench TR.

Here, when the bank BA covers the trench TR, the purpose for the trench TR may not be acquired, so the trench TR may be made of silicon nitride (SiNx) that is an inorganic material for following the cross-sectional profile of the trench TR. The bank BA may cover edge (or circumference) portions of the anode electrode ANO, and be deposited as following the cross-sectional shape of the bank BA. Therefore, the bank BA is deposited on the lower metal layer 10 stacked on the bottom surface of the trench TR.

The upper metal layer 20 is on the bank BA in the trench TR. In one embodiment, the upper metal layer 20 has a thickness of 300 Å to 500 Å. The upper metal layer 20 includes any one of silver (Ag), platinum (or palladium) (Pd), copper (Cu) and silver-palladium-copper alloy (APC).

The emission layer EL is deposited on the entire surface of the substrate 110 including the trench TR. The emission layer EL is on the upper metal layer 20 in the trench TR. In the emission area of the pixel P, the emission layer EL is deposited on the anode electrode ANO. The emission layer EL is deposited on the bank BA in the pixel P region. Due to the depth of the trench TR, the emission layer EL may be physically and electrically separated (or divided) per each pixel P by the undercut in the trench TR.

In the third embodiment of the present disclosure, the planarization layer PL may have a thickness in range of 1 ㎛ to 2 ㎛. For example, the planarization layer PL may have a thickness of 1.8 ㎛ and the trench TR may have a depth of 1.8 ㎛. In detail, when the lower metal layer 10 with a thickness of about 200 Å, the bank BA with a thickness of about 3,000 Å, and the upper metal layer 20 with a thickness of about 500 Å are stacked, the whole thickness may be 3,700 Å which is less than 4,000 Å. As the result, the trench TR may be secured with a thickness of 14,000 Å(=1.4 ㎛). Therefore, the emission layer EL may be separated per each pixel P.

A cathode electrode CAT is deposited on the emission layer EL. The cathode electrode CAT may include a first cathode layer CAT1, a second cathode layer CAT2 and a third cathode layer CATS. In the trench TR, the cathode electrode CAT is on the emission layer EL that is in the trench TR. In particular, the cathode electrode CAT is not disconnected at the trench TR, but continuously connected over all pixels P.

As the result, referring to the stacking structure in the trench TR, the lower metal layer 10, the bank BA, the upper metal layer 20 and the cathode electrode CAT are sequentially stacked from bottom to up. From an optical viewpoint, it has a structure in which the lower metal layer 10 as a semi-transparent layer, the bank BA as a transparent layer, and the upper metal layer 20 and the cathode electrode CAT as a reflective layer are sequentially stacked. Therefore, by adjusting (or controlling) the thickness of the semi-transparent layer (the lower metal layer 10) and/or the thickness of the transparent layer (the bank BA), external light reflection may be suppressed be the mechanism same as the cathode electrode CAT.

The electroluminescence display according to various embodiments of the present disclosure has a merit that even when ultra-high resolution is implemented, the horizontal leakage current may be prevented by the trenches disposed between pixels. Accordingly, the present disclosure may provide an ultra-high-resolution display having high image quality. In addition, the cathode electrode and the lines have an external light reflection suppression structure. Furthermore, since the trenches also have an external light reflection suppression structure, the image quality distortion due to external light reflection may be prevented.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
- a pixel defined on a substrate;
- a first electrode disposed at the pixel;
- a trench that at least partially surrounds the pixel;
- a first metal layer on a bottom surface in the trench;
- a bank on an outer periphery of the first electrode and on the first metal layer in the trench;
- a second metal layer in the trench, the second metal layer on the bank in the trench;
- an emission layer on the first electrode, the bank, and the second metal layer; and
- a second electrode on the emission layer.

2. The electroluminescence display according to claim 1, further comprising:
- a first dummy electrode between the first metal layer and the bank in the trench, the first dummy electrode disconnected from the first electrode.

3. The electroluminescence display according to claim 1, wherein the first electrode is on a planarization layer that covers the substrate, and the trench is an opening through a thickness of the planarization layer.

4. The electroluminescence display according to claim 1, wherein the second electrode includes:
- a first electrode layer on the emission layer;
- a second electrode layer on the first electrode layer; and
- a third electrode layer on the second electrode layer.

5. The electroluminescence display according to claim 1, wherein the first metal layer has a first thickness such that the first metal layer has a light transmittance in a range of 40% to 60%, and the bank has a second thickness such that a first light reflected by a surface of the first metal layer and a second light reflected by the second metal layer are phase cancelled.

6. The display according to claim 1, wherein the first metal layer has a first thickness in a range of 100 Å to 200 Å, the bank has a second thickness of 3,000 Å, and the second metal layer has a third thickness in a range of 300 Å to 500 Å.

7. The display according to claim 1, wherein the bank includes an inorganic material having silicon nitride, and the bank is on an upper surface of edges of the first electrode, side surfaces of the first electrode, and a side wall of the trench.

8. The electroluminescence display according to claim 2, wherein the first electrode is disconnected from the first dummy electrode by the trench, the trench divides the emission layer between two adjacent pixels, and the second electrode is connected over the trench between the two adjacent pixels.

9. The electroluminescence display according to claim 3, further comprising:
- a color filter between the planarization layer and the substrate, the color filter overlapping the emission layer that is on the first electrode;
- a driving element that is electrically connected to the first electrode; and
- a data line at both sides of the trench.

10. The electroluminescence display according to claim 9, wherein the data line includes:
- a metal oxide layer, and
- a metal layer on the metal oxide layer.

11. The electroluminescence display according to claim 10, wherein the metal oxide layer has a thickness by which a first light reflected by a surface of the metal oxide layer and a second light reflected by the metal layer have opposite phases.

12. The electroluminescence display according to claim 10, wherein the metal oxide layer includes a metal oxide material having a thickness in a range of 100 Å to 500 Å, and the metal layer includes a metal material having a thickness in a range of 2,000 Å to 4,000 Å.

13. The electroluminescence display according to claim 4, wherein the first electrode layer has a first thickness such that the first electrode layer has a light transmittance in a range of 40% to 60%, the second electrode layer has a second thickness such that a first light reflected by a surface of the first electrode layer and a second light reflected by the third electrode layer are phase cancelled, and the third electrode layer has a third thickness such that the third electrode layer has a light transmittance of 100%.

14. The electroluminescence display according to claim 4, wherein the first electrode layer includes a metal material with a thickness in range of 100 Å to 200 Å, the second electrode layer is a conductive organic layer including a domain material and a dopant, and the third electrode layer includes a metal material with a thickness in a range of 2,000 Å to 4,000 Å.

15. The display according to claim 5, wherein the second metal layer has a third thickness such that the second metal layer has a light transmittance of at least 80% light transmitted through the bank.

16. An electroluminescence display comprising:

a substrate;

a transistor on the substrate;

a planarization layer on the transistor;

a light emitting element on the planarization layer that is electrically connected to the transistor, the light emitting element including a first electrode, an emission layer including a first portion that is on the first electrode, and a second electrode including a first portion that is on the first portion of the emission layer;

a trench through a thickness of the planarization layer, the trench at least partially surrounding the light emitting element;

a first metal layer in the trench;

a bank including a first portion and a second portion, the first portion of the bank on the first electrode and the second portion of the bank on the first metal layer in the trench;

a second metal layer in the trench, the second metal layer on the second portion of the bank that is in the trench, wherein a second portion of the second electrode extends from the first portion of the second electrode into the trench such that the second portion of the second electrode is on the second portion of the bank that is in the trench.

17. The electroluminescence display of claim 16, wherein the emission layer further includes a second portion that is between the second portion of the second electrode and the second portion of the bank in the trench, the second portion of the emission layer disconnected from the first portion of the emission layer.

18. The electroluminescence display of claim 16, wherein the first portion of the second electrode and the second portion of the second electrode that is in the trench are electrically connected to each other.

19. The electroluminescence display of claim 16, wherein the first metal layer has a first thickness such that the first metal layer has a light transmittance in a range of 40% to 60%, and the bank has a second thickness such that a first light reflected by a surface of the first metal layer and a second light reflected by the second metal layer are phase cancelled.

20. The electroluminescence display of claim 17, wherein the second electrode includes:

a first electrode layer having a first portion and a second portion, the first portion of the first electrode layer on the first portion of the emission layer and the second portion of the first electrode layer on the second portion of the emission layer in the trench;

a second electrode layer having a first portion and a second portion, the first portion of the second electrode layer on the first portion of the first electrode layer and the second portion of the second electrode layer on the second portion of the first electrode layer in the trench; and a third electrode layer having a first portion and a second portion, the first portion of the third electrode layer on the first portion of the second electrode layer and the second portion of the third electrode layer on the second portion of the second electrode layer in the trench.

21. The electroluminescence display of claim 20, further comprising:

a dummy electrode between the first metal layer and the second portion of the bank in the trench, the dummy electrode comprising a same material as the first electrode and is disconnected from the first electrode.

22. An electroluminescence display comprising:

a substrate;

a transistor on the substrate;

a planarization layer on the transistor;

a light emitting element on the planarization layer that is electrically connected to the transistor, the light emitting element including a first electrode, an emission layer on the first electrode, and a second electrode on the emission layer;

a bank including a first portion that is on the first electrode;

a trench through a thickness of the planarization layer, the trench at least partially surrounding the light emitting element; and a light reflection suppression structure in the trench, the light reflection suppression structure including a plurality of metal layers configured to suppress reflection of light incident on the light reflection suppression structure, the light reflection suppression structure in the trench further comprising:

a second portion of the bank that extends from the first portion of the bank, the second portion of the bank between the first metal layer and the second metal layer in the trench;

a dummy emission layer on the second portion of the bank in the trench, the dummy emission layer disconnected from the emission layer; and a portion of the second electrode on the dummy emission layer in the trench, the portion of the second electrode extending from a portion of the second electrode that is on the emission layer.

23. The electroluminescence display of claim 22, wherein the plurality of metal layers includes a first metal layer at a bottommost surface of the trench and a second metal layer on the first metal layer.

24. The electroluminescence display of claim 22, wherein the first metal layer has a first thickness such that the first metal layer has a light transmittance in a range of 40% to 60%, and the bank has a second thickness such that a first light reflected by a surface of the first metal layer and a second light reflected by the second metal layer are phase cancelled.

25. The electroluminescence display of claim 22, wherein the second electrode includes:

a first electrode layer on the emission layer, the first electrode layer extending into the trench;

a second electrode layer on the first electrode layer, the second electrode layer extending onto the first electrode layer in the trench; and a third electrode layer on the second electrode layer, the third electrode layer extending onto the second electrode layer in the trench.

* * * * *